(12) United States Patent
Ammann et al.

(10) Patent No.: US 6,219,899 B1
(45) Date of Patent: Apr. 24, 2001

(54) PANEL POSITIONING METHOD

(75) Inventors: Hans Hugo Ammann, Chester; Francis LoVasco, Succasunna; Michael A. Oien, Chatham Township, Morris County, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/199,143

(22) Filed: Nov. 24, 1998

Related U.S. Application Data

(62) Division of application No. 08/581,644, filed on Dec. 28, 1995, now Pat. No. 5,862,583.

(51) Int. Cl.$^7$ ................................................ B23Q 7/00
(52) U.S. Cl. ................................ 29/559; 29/464; 269/47
(58) Field of Search ............................. 29/281.1, 281.5, 29/464, 466, 468, 559, 829, 830, 831, 846, 465; 269/47, 50, 51, 73

(56) References Cited

U.S. PATENT DOCUMENTS

| | | | |
|---|---|---|---|
| 5,014,413 | * | 5/1991 | Ammann .............................. 29/559 |
| 5,862,583 | * | 1/1999 | Ammann et al. ..................... 29/559 |

* cited by examiner

Primary Examiner—S. Thomas Hughes
Assistant Examiner—Essama Omgba
(74) Attorney, Agent, or Firm—Leo Stanger

(57) ABSTRACT

Panels are positioned relative to a pattern by moving the pattern onto a registration mechanism having contact elements, engaging contact areas on the pattern with contact elements by moving the contact elements synchronously and equidistantly while allowing the registration mechanism to move as the elements engage the contact areas, locking the position of the registration mechanism, and engaging contact areas on sequential panels by moving the contact elements of the locked registration mechanism synchronously and equidistantly to contact areas on one panel after the other.

14 Claims, 3 Drawing Sheets

PANEL POSITIONING METHOD

This is a divisional application of Ser. No. 08/581,644 filed Dec. 28, 1995, now U.S. Pat. No 5,862,583.

FIELD OF THE INVENTION

This invention relates to methods and apparatuses for positioning panels on a work surface in register with a tool to permit accurate operations on the panel, and particularly to methods of positioning printed circuit panels relative to stencil or screen printing patterns.

BACKGROUND OF THE INVENTION

U.S. Pat. No. 4,793,052 illustrates, methods and apparatuses for positioning panels, such as printed circuit panels, on a work surface. A registration mechanism displaces engaging member, such as locating pins, equidistantly and synchronously in opposite directions into engagement with contact areas, such as locating slots or holes in the panel, to fix the panel position relative to the work surface so that a tool can perform its function with respect to the panel.

Often, the tool operating on the panels, such as a frame holding a printing pattern, must move repetitively with great accuracy relative to successive panels mounted on the work face to complete the processing on each panel. Such tools must also operate in registry with the panels. However, the weight of the tool or the complexity of its mounting and movement makes registration of the tool with the panels or the co-ordinates of the panels difficult.

SUMMARY OF THE INVENTION

According to an embodiment of the invention, the registration mechanism that contains and moves the pins is itself movable relative to the workface, and the registration mechanism is moved into registry with the tool by engaging the mechanism's engagement elements with contact areas on the tool and then fixing the registration mechanism in position relative to the tool operating position, before registering the panel with the tool.

The various features of novelty which characterize the invention are pointed out with specificity in the claims forming a part of this specification. Objects and advantages of the invention will become evident from the following detailed description when read in light of the accompanying drawings.

DETAILED DESCRIPTION OF PREFERRED EMBODIMENTS

Figure 1:
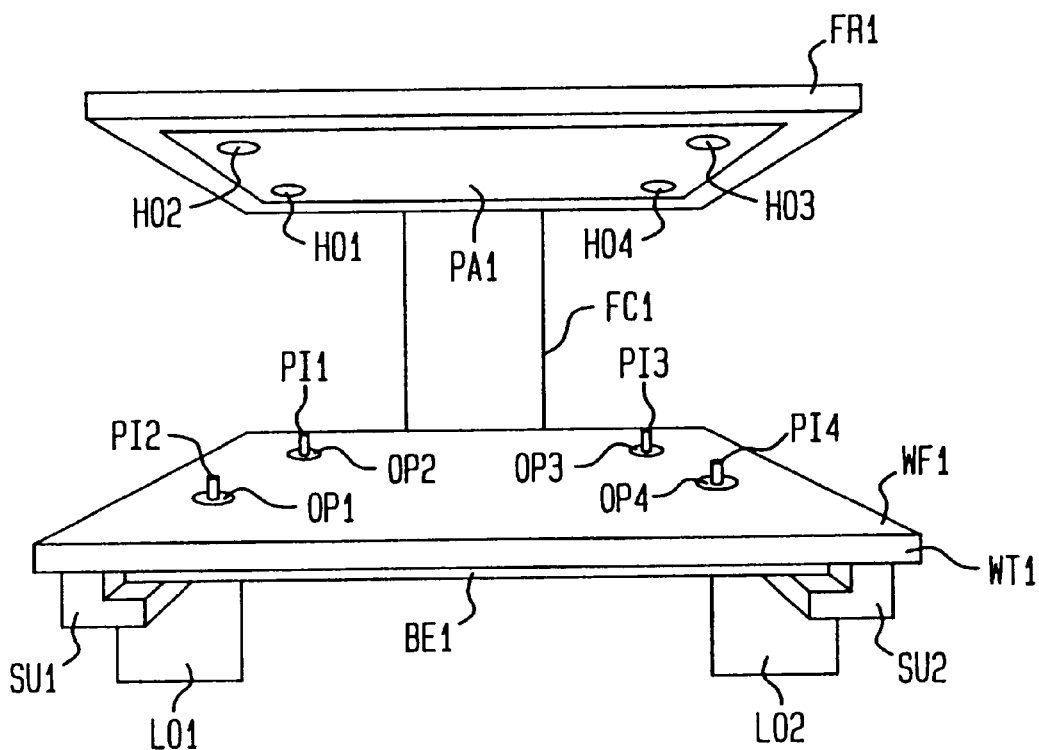
FIG. 1 is a somewhat schematic perspective of a work station embodying features of the invention.

FIGS. 1 to 4, where like parts are designated with like reference characters, show an embodiment of the invention. Here, a frame FR1 fixedly holds a pattern PA1 and a frame control FC1 moves the frame and the pattern vertically down against a work table WT1 with a workface WF1. A board center registration (BCR) mechanism BE1 under the workface WF1 projects engaging elements illustratively in the form of vertical locating pins PI1, PI2, PI3, and PI4 through respective larger openings OP1, OP2, OP3, and OP4 in the work table WT1. When the pattern PA1 is against the workface WF1, the pins PI1, PI2, PI3, and PI4 also project through tooling features or slots illustratively in the form of holes HO1, HO2, HO3, and HO4, larger than the pins, in the pattern PA1.

BCR mechanisms such as BE1 are described in U.S. Pat. No. 4,793,052. The BCR mechanism BE1 moves the vertical pins PI1, PI2, and PI3, PI4 horizontally parallel to an axis HX1–HX2. The latter pass through the central portion of the workface WF1 and pattern PA1 when the pattern PA1 is on the workface WF1 and also passes between the pins PI1 and PI2 and between the pins PI3 and PI4. The BCR tool simultaneously moves the pins PI1 and PI2, in a direction opposite to the pins PI3 and PI4, and in equidistant amounts, about a horizontal axis HY1–HY2 transverse to the axis HX1–HX2. The latter passes through the central portion at the workface WF1 and pattern PA when the latter is down against the workface WF1.

Figure 2:
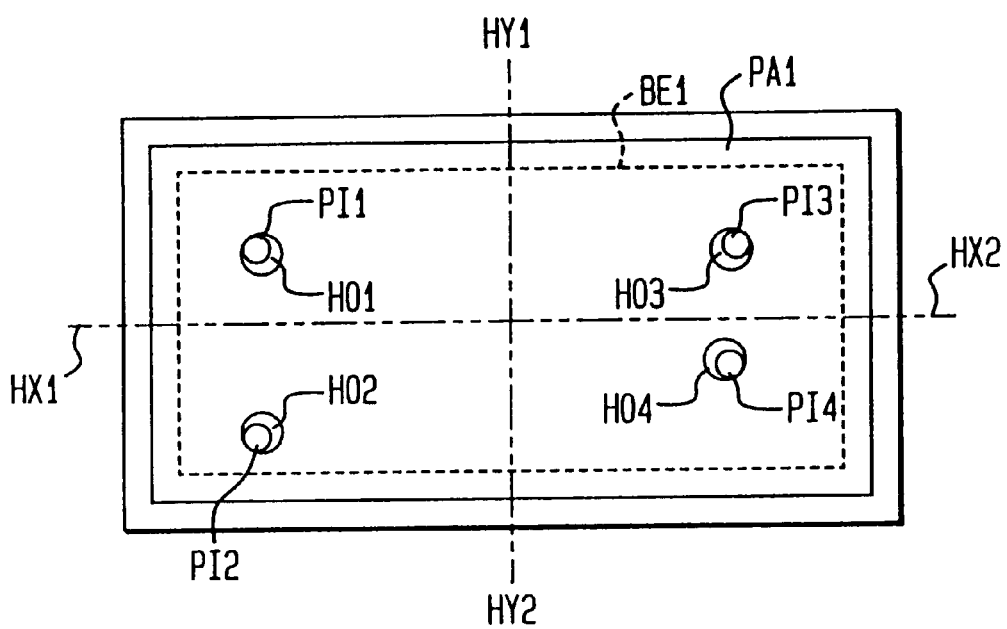
FIG. 2 is a plan-view of a work face and registration mechanism in FIG. 1.

The holes HO1, HO2, HO3, and HO4 are arranged relative to the pins PI2, PI2, PI3, and PI4 so that when the BCR mechanism BE1 moves the pins PI1, PI2, and PI3, PI4 synchronously and equidistantly outward parallel to the axis HX1–HX2, the pins forcibly engage localized areas of the holes HO1 to HO4 as shown in FIG. 2. The openings OP1 to OP4 are sufficiently large to permit engagement between the pins PI1 to PI4 and HO1 to HO4. Specifically in the engaged positions, the pin PI1 engages the Northwest area of the hole HO1, the pin PI2 engages the Southwest HO2, the pin PI3 engages the Northeast area of hole HO3, and the pin PI4 engages the Southeast area of the hole HO4.

The BCR mechanism BE1 under the worktable WT1 floats horizontally, for example, on supports SU1 and SU2 relative to the worktable along both axes HX1–HX2 and HY1–HY2. To achieve registration of the BCR tool BE1 and the pattern PA1, i.e. in order for the engagement of pins PI1 to PI4 to forcibly engage the contact areas of holes HO1 to HO4 as shown in FIG. 2, the BCR mechanism moves relative to the worktable WT1. When such registration, i.e. such engagement between the pins PI1 to PI4 and edges of the holes HO1 to HO4 occurs, schematically shown locking members LO1 and LO2 on the supports SU1 and SU2 lock the horizontally floating BCR tool BE1 in position on the worktable WT1. This fixes the position of the BCR mechanism BE1 relative to the pattern PA1 fixed on the frame FR1. In this position the BCR mechanism BE1 and the pattern are in registration.

Figure 3:
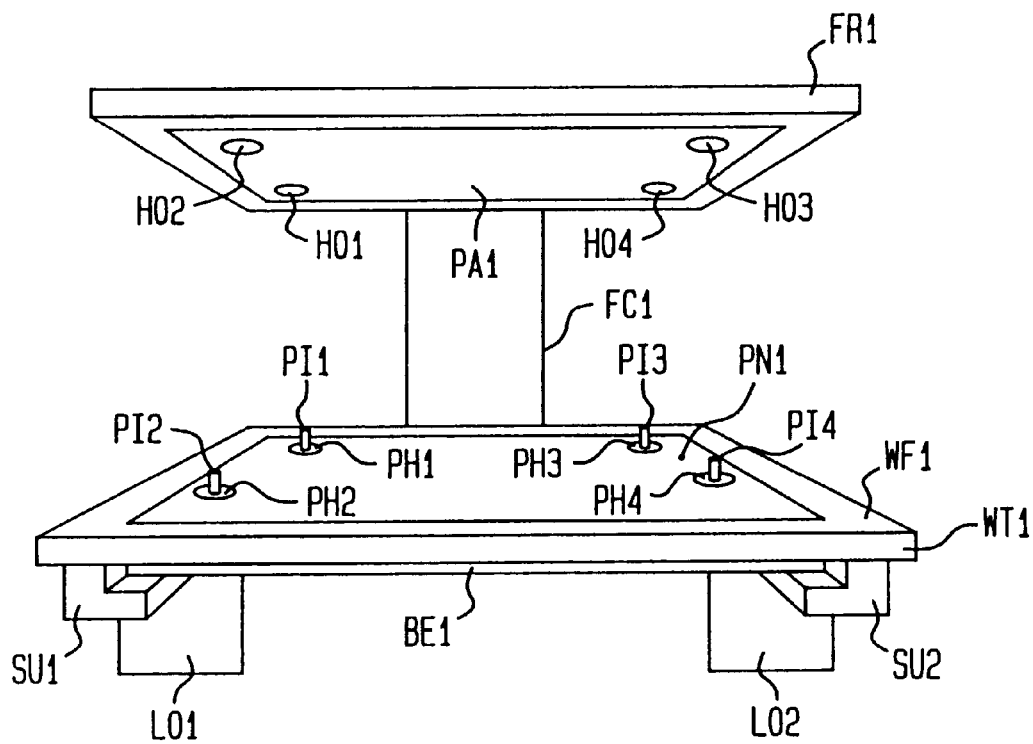
FIG. 3 is another view of the work station in FIG. 1 showing a panel in position on the work face.

The BCR mechanism BE1 now withdraws the pins PI1 to PI4 inwardly toward the center axis HY1–HY2 synchronously and equidistantly and the frame control FC1 lifts the frame FR1 and the pattern PA1 from the workface WF1. Manual or automatic means then place a panel PN1 to be oriented on the workface WF1, as shown in FIG. 3, so that panel tooling features in the form of panel holes PH1, PH2, PH3, and PH4 receive the pins PI1, PI2, PI3, and PI4 respectively. The panel holes PH1 to PH4 are larger than the pins PI1 to PI4 so the pins slip easily into the holes. Suitable means prevent the panel from being placed upside-down or backwards about either axis HX1–HX2 or HY1–HY2. For this purpose, according to one embodiment, the pins PI1 to PI4 are offset from each other unsymmetrically about the respective axes. Also the holes HO1 to HO4 and panel holes PH1 to PH4 and the pins PI1 to PI4 are congruently offset about the axes HX1–HX2, and HY1–HY2.

According to another embodiment of the invention, the pins PI1 to PI4 are located symmetrically. However, preferably, in such an embodiment, a separate projection or other device prevents the panel from being place upside down or backwards.

Figure 4:
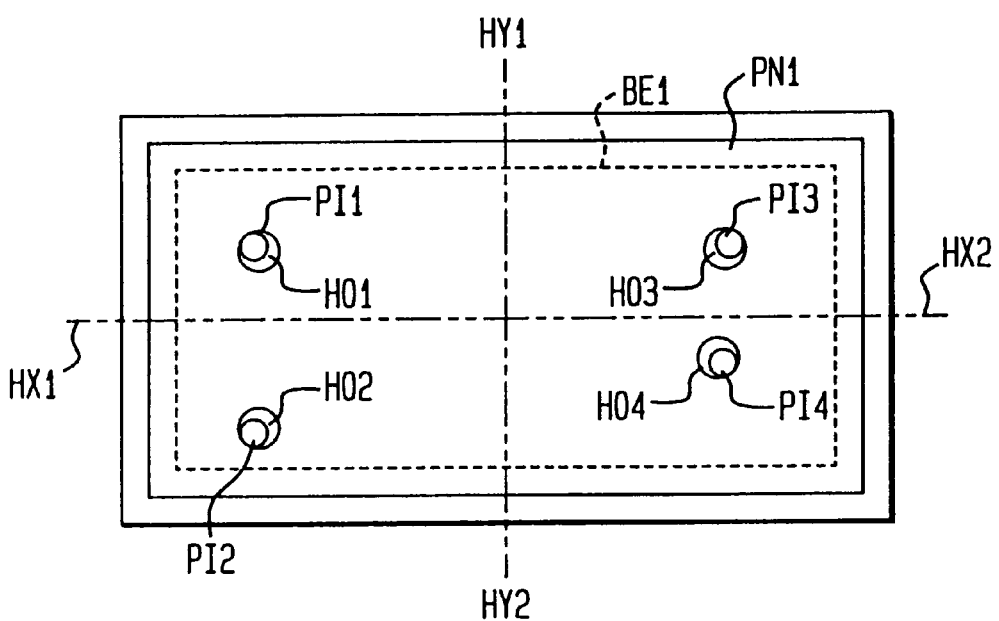
FIG. 4 is a plan view of the work face in FIGS. 2 and 3 with the panel in position on the work face.
Figure 5:
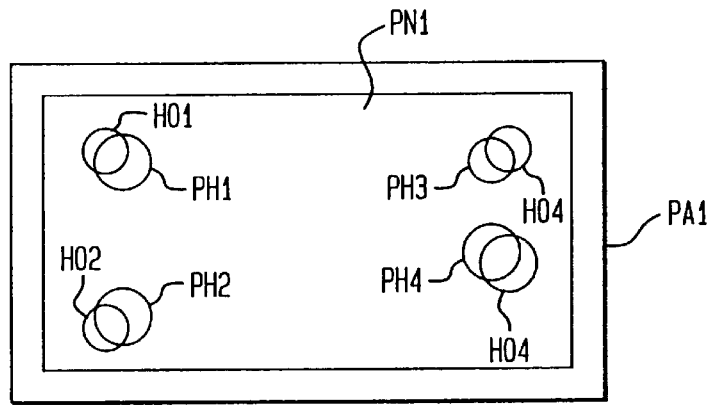
FIG. 5 is a plan schematic showing relationship of holes it various members of FIGS. 1 to 4.

The BCR mechanism now moves the pins PI1 to PI4 synchronously and equidistantly outwardly parallel to the axis HX1–HX2. The panel holes PH1 to PH4 are sized and arranged so that synchronous equidistant outward movement of the pins PI1 to PI4 parallel to the axis HX1–HX2 ultimately results in forcible engagement of the pins PI1 to PI4 with respective Northwest, Southwest, Northeast, and Southeast regions of the panel holes PH1 to PH4 as shown in FIG. 4. The outward movement of the pins PI1 to PI4 on the BCR mechanism BE1, now secured to the worktable WT1, moves the panel PN1 into registration with the pattern PA1. To prevent subsequent interference of pins PI1 to PI4 with the holes HO1 to HO4, the holes HO1, HO2 are further from the holes HO3, HO4 than are the holes PH1, PH2 from the holes PH3, PH4. FIG. 5 illustrates this relative distribution of holes. Alternatively, the holes HO1 to HO4 are larger than the holes PH1 to PH4. According to another embodiment, the pins do not protrude above the panel PN1.

The control FC1 now moves the frame FR1 and the pattern PA1 down into contact or other operating position relative to the panel PN1 and the operation, such as printing, proceeds. The further outward position of the holes HO1, HO2 from the holes HO3, HO4 than the holes PH1, PH2 from the holes PH3, PH4 avoids any interference between the pins PI1 to PI4 with the holes HO1 to HO4.

After completion of the operation the control FC1 lifts the frame FR1, the BCR mechanism BE1 moves the pins PI1, PI2, and PI3, PI4 synchronously and equidistantly inward parallel to the axis HX1–HX2 to release the patterned panel, and the patterned panel PN1 is then removed. The work face WF1 then receives the next panel PN1, the BCR mechanism BE1 moves the pins PI1, PI2, and PI3, PI4 synchronously and equidistantly outward parallel to the axis HX1–HX2, the pins forcibly engage localized areas in the holes PH1 to PH4 of the next panel PA1. The control FC1 lowers the frame FR1 and the pattern PA1, and the operation is repeated. The control FC1 then lifts the frame FR1 the BCR mechanism BE1 moves the pins PI1, PI2, and PI3, PI4 synchronously and equidistantly inward parallel to the axis HX1–HX2, and the panel PA1 is removed. The entire procedure is then repeated continuously.

Figure 6:
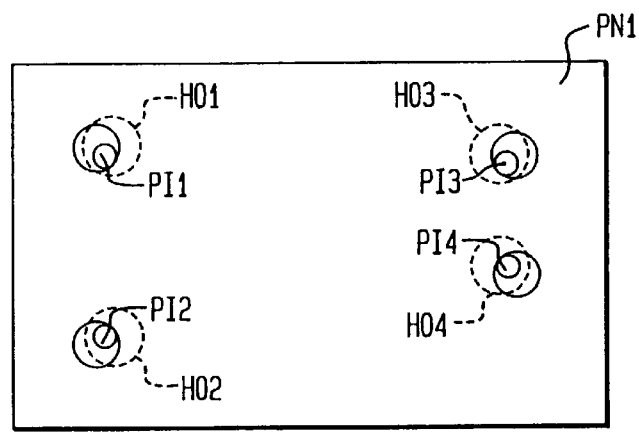
FIG. 6 is a plan view showing another embodiment of the invention.

According to another embodiment of the invention, the pins PI1 to PI4 are arranged to move inwardly relative to the holes HO1 to HO4 and the panel holes PH1 to PH4 to position the BCR mechanism. BE1 and the panels PN1. This is shown in FIG. 6.

Figure 7:
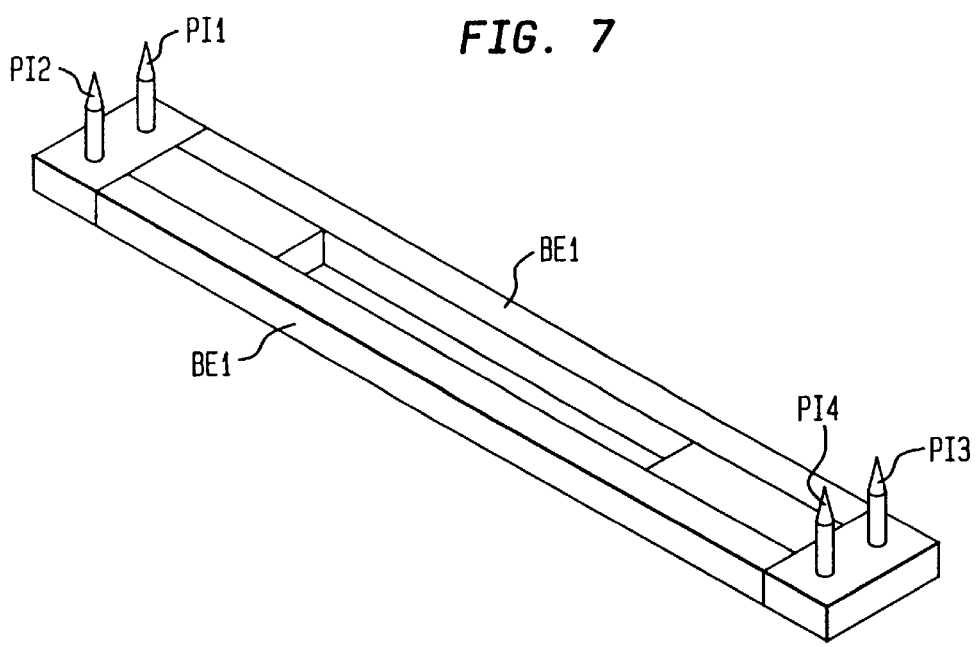
FIG. 7 is a perspective view of a board center registration (BCR) mechanism for use in the device of FIGS. 1 to 4.

A BCR mechanism BE1 is shown in FIG. 7. U.S. Pat. No. 4,793,105 shows another BCR mechanism.

The registration holes PH1 to PH4 in the panels PN1 are formed in the same operation and at the same time to assure subsequent accuracy of positioning. Separately, the holes HO1 to HO4 in the pattern PA1 are formed in the same operation and at the same time to assure subsequent accuracy of positioning. For the pattern, this is all done at the time the pattern is created, the latter by means such as etching. This ensures proper alignment of registration of features and registration holes.

According to an embodiment of the invention, the pattern PA1 is a stencil for placing solder paste on the panel PN1 in the form of a printed circuit board. In that case, solder paste is then placed on the PC board through the stencil. The solder paste is then processed in the usual manner, the stencil raised, the board released by the pins, the board removed, and the process repeated with a new panel.

During setup the contact points on the pins are inboard of the contact pins points on the holes PH1 to PH4 and HO1 to HO4. This avoids interference.

According to an embodiment of the invention, the holes HO1 to HO4 are concentric but are sufficiently larger to prevent interference.

According to another embodiment of the invention, the pins PI1 to PI4 engage the holes HO1 to HO4 by moving inwardly. According to another embodiment of the invention, the holes may be of different sizes as long as they are large enough to permit the pins to pass through.

While embodiments of the invention have been described in detail, it will be evident to those skilled in the art, that the invention may be embodied otherwise without departing from its spirit and scope.

What is claimed is:

1. A method of sequentially positioning panels relative to a pattern having a plurality of contact areas, which comprises:

moving the pattern into planar proximity of a registration mechanism on a work surface having a plurality of contact elements;

moving the registration mechanism relative to the work surface into registration with the pattern;

releasing the contact elements of the registration mechanism from engagement with the contact areas of the pattern and removing the pattern from the registration mechanism moving a panel onto the work surface, engaging the contact elements with the panel by moving the contact elements on the registration mechanism until all contact elements engage contact areas on the panel, processing the panel, and moving the movable contact elements of the registration mechanism out of engagement with the contact areas of the processed panel and removing the panel from the work surface;

repeating the step of moving a panel onto the work surface, the step of enaring the contact elements with the panel, and the step of moving the movable contact elements out of engagement with the contact areas of the processed panel and removing the panel from the work surface;

the step of moving the registration mechanism into registration with the pattern including maintaining the registration mechanism movable relative to the pattern, engaging the contact elements with the contact areas on the pattern by moving the contact elements on the registration mechanism until the elements all engage the contact areas on the pattern, and then locking the registration mechanism in position.

2. The method as in claim 1, wherein said contact areas on said pattern and said panels are holes and said contact elements are pins and said pins are moved senchronously and equidistantly relative to said registration mechanism.

3. The method as in claim 2, wherein the number of holes is four and the number of pins is four;

a first two of said four pins being moved in one direction and the second two of said four pins being moved in a direction opposite the first two of said four pins during the step of enagingthe contact areas.

4. The method as in claim 3, wherein the first two of said four pins are moved away from the second of two of said four pins during the step of engaging the contact areas.

5. The method as in claim 3, wherein the first two of said four pins are moved toward the second two of said four pins during the step of engaging the contact areas.

6. The method as in claim 3, wherein the first two of said four pins are non-symmetrically located relative to said second of said four pins.

7. The method as in claim 1, wherein the step of engaging the contact elements with the contact areas on the pattern includes moving a first of said plurality of contact elements in one direction and a second of said plurality of contact elements in an opposite direction.

8. The method as in claim 7, wherein said contact areas on said pattern and said panels are holes and said contact elements are pins.

9. The method as in claim 1, wherein the step of moving each panel into registration with the pattern includes replacing the processed panel with a subsequent panel after disengaging the plurality of contact elements from said contact areas on the processed panel.

10. The method as in claim 9, wherein said contact areas on said pattern and said panels are holes and said contact elements are pins.

11. The method as in claim 9, wherein the step of engaging the plurality of contact areas on the pattern with contact elements includes moving a first of said plurality of contact elements in one direction and a second of said plurality of contact elements in a direction orposite to the first direction.

12. The method as in claim 1, wherein the contact areas on said pattern are formed simultaneously and, separately said contact areas on said panels are formed simultaneously.

13. The method as in claim 12, wherein said contact areas on said panels are edges of holes formed in alignment with each other and said contact areas on said patterns are edges of holes formed in alignment with each other.

14. The method as in claim 1, wherein:

the step of moving the registration mechanism relative to said pattern includes fixedly mounting said pattern on a pattern holder and moving said registration mechanism relative to said pattern holder during the step of moving the registration mechanism before engaging the plurality of contact areas on said panels.

\* \* \* \* \*